United States Patent
Matsuzawa et al.

(10) Patent No.: US 6,613,497 B1
(45) Date of Patent: Sep. 2, 2003

(54) LIGHT EXPOSURE METHOD

(75) Inventors: Nobuyuki Matsuzawa, Tokyo (JP); Hiroaki Oizumi, Tokyo (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 09/697,736

(22) Filed: Oct. 27, 2000

(30) Foreign Application Priority Data

Oct. 28, 1999 (JP) ............................................. 11-307718

(51) Int. Cl.⁷ .............................. G03C 5/00; G21G 5/00
(52) U.S. Cl. ...................... 430/311; 430/331; 430/966; 430/967; 430/296; 250/492.1; 250/492.2
(58) Field of Search ........................ 430/311–331, 966, 430/967, 296; 250/492.1–492.2

(56) References Cited

U.S. PATENT DOCUMENTS

| | | | |
|---|---|---|---|
| 4,634,645 A | | 1/1987 | Matsuda et al. ............ 430/296 |
| 4,816,377 A | * | 3/1989 | Collet et al. ................ 430/194 |
| 5,352,899 A | * | 10/1994 | Golovanivsky et al. . 250/423 R |
| 5,510,230 A | * | 4/1996 | Tennant et al. .......... 250/492.2 |
| 6,177,231 B1 | * | 1/2001 | Ishii et al. ..................... 216/16 |

FOREIGN PATENT DOCUMENTS

| | | |
|---|---|---|
| DE | 146220 | 1/1981 |
| DE | 277773 | 4/1990 |
| JP | 52-146218 | 12/1977 |
| JP | 61-148445 | 7/1986 |

OTHER PUBLICATIONS

New Fluoropolymer Developed as a Photoresist Material for Next–Next–Generation Semiconductors, Feb. 14, 2001, Asahi Glass Co., Ltd., Mr. Yoshimi Akabane.

Successful Development of a Fluoropolymer Photoresist Base for F2 Excimer Laser Applications Forming Fine Structures in Practical 250nm Films, Jan. 17, 2002; Asahi Glass Co., Ltd. Mr. Akihiko Ninose.

Lithography at a Wavelength of 193nm, vo. 41, Nos. ½, 1997; M. Rothchild, et al.

* cited by examiner

*Primary Examiner*—Mark F. Huff
*Assistant Examiner*—Daborah Chacko-Davis
(74) *Attorney, Agent, or Firm*—Ronald P. Kananen, Esq.; Rader, Fishman & Grauer PLLC

(57) ABSTRACT

A light exposure method for ultra-fine processing for a semiconductor in which light transmittance of a resist layer in a wavelength range of the extreme ultraviolet (EUV) light is improved to enable ultra-fine processing more elaborate than is possible with conventional methods. In selectively exposing a resist layer to X-rays, a high molecular material obtained by replacing at least a portion of hydrogen atoms of a pre-existing resist material by a substituent containing an alkyl group and/or a substituent containing an aromatic ring is used as a high molecular material of the resist layer. By replacing the hydrogen atoms of the high molecular materials with a substituent containing an alkyl group or a substituent containing an aromatic ring, the proportion of oxygen atoms in an atom of the high molecular materials becomes relatively smaller to suppress optical absorption of the entire high molecular material. The line absorption coefficient in an x-ray wavelength is $3.80\mu^{-1}$ or less.

8 Claims, 1 Drawing Sheet

LIGHT EXPOSURE METHOD

BACKGROUND OF THE INVENTION

1. Field of the Invention

This invention relates to a light exposure method for ultra-fine processing in the field of a semiconductor.

2. Description of Related Art

In, for example, the field of a semiconductor, establishment of a new processing technique providing for ultra-fine processing to a size not larger than 0.1 $\mu$m is incumbent with the tendency towards high integration semiconductor devices.

In processing an ultra-fine pattern, the so-called lithographic technique is indispensable. At present, development of a new light exposure technique employing an extreme ultraviolet (EUV) rays in the vicinity of the wavelength of 7 to 16 nm, in addition to the ultraviolet rays by a conventional mercury lamp or excimer laser, is going on briskly in order to improve optical resolution to cope with shorter wavelengths used for light exposure to achieve the ultra-fine processing.

However, the wavelength range of the extreme ultraviolet (EUV) suffers a problem that, with the wavelength range of the ultraviolet (EUV), usual resist materials undergo significant optical absorption, such that the illuminated light cannot reach the deeper portion in the resist layer to deteriorate the resist pattern.

This deterioration in the resist pattern hampers ultra-fine processing and, hence, it is desirable to improve the ultra-fine processing.

SUMMARY OF THE INVENTION

It is therefore an object of the present invention to eliminate the aforementioned problem and to provide a light exposure method in which the problem pertinent to light transmittance of a resist layer in the wavelength range of the extreme ultraviolet (EUV) may be eliminated to enable more elaborate ultra-fine processing.

According to the present invention, there is provided a light-exposure method in which a resist layer is exposed selectively to X-rays, vacuum ultraviolet rays, extreme ultraviolet rays or soft X-rays to pattern the resist layer to a pre-set shape, wherein, as a high molecular material of the resist layer, a high molecular material is obtained on replacing at least a portion of hydrogen atoms of a pre-existing resist material by a substituent containing an alkyl group and/or a substituent containing an aromatic ring.

The resist material herein means the totality of resist materials known prior to filing of the present application.

Usually, in the high molecular materials constituting the resist layer, the presence of oxygen atoms is indispensable for displaying resist characteristics. In high molecular materials, the portions subjected to a certain chemical reaction due to light illuminated thereon to produce changes in the physical values of the illuminated and non-illuminated portions to demonstrate resist characteristics are groups necessarily containing oxygen, such as ester, phenolic, alcoholic or carboxylic groups.

In the wavelength range of the extreme ultraviolet (EUV) light, optical absorption of oxygen is larger than that of carbon or hydrogen, and is responsible for lowering of the light transmittance of the high molecular materials. The optical absorption per oxygen atom is as large as approximately thrice that of carbon atoms, and approximately 50 to 100 times that of the hydrogen atoms.

According to the present invention, in which hydrogen atoms in the pre-existing resist material are replaced by substituents containing alkyl groups or substituents containing aromatic rings, the proportion of oxygen atoms in the atoms making up the high molecular materials is relatively small to suppress the optical absorption of the high molecular material in its entirety.

According to the present invention, in which a high molecular materials having an alkyl group or an aromatic ring introduced therein to raise the light transmittance in the wavelength range of the extreme ultraviolet rays is used as a resist material, a resist pattern of a desirable shape may be produced to enable ultra-fine processing more elaborate than is possible with the conventional method.

Moreover, in an extreme ultraviolet (EUV) lithographic process, the film thickness of the resist layer can be increased by employing a high molecular material exhibiting high transparency, thereby improving resistance to etching of the resist layer.

DESCRIPTION OF THE PREFERRED EMBODIMENTS

Figure 1:
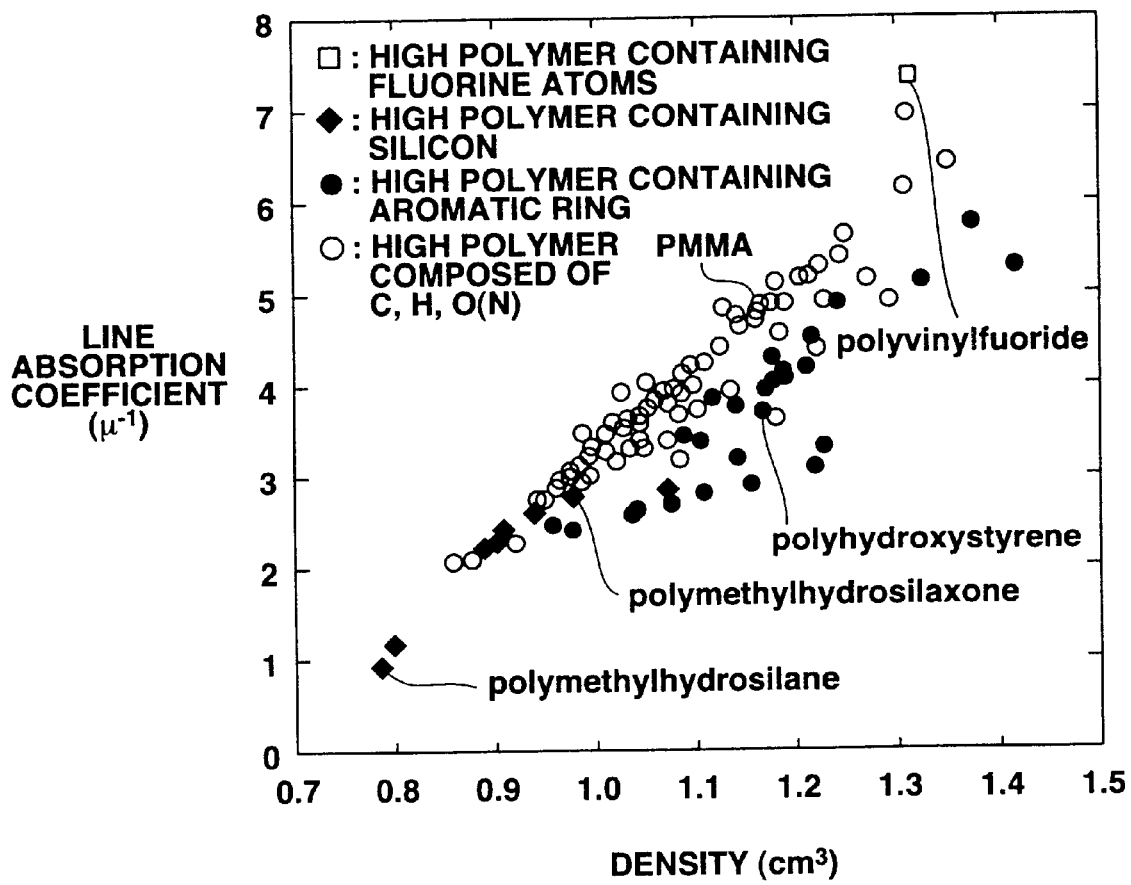
FIG. 1 is a graph illustrating the of line absorption coefficients and density distribution of a variety of high molecular materials.

Referring to the drawings, the light exposure method according to the present invention will be explained in detail.

The light exposure method of the present invention is applied to, for example, the processing of ultra-fine patterns in a semiconductor device. Specifically, the method includes a step of coating a resist layer exhibiting the photosensitive action on a substrate, a step of selectively exposing and thereby photosensitizing the resist layer to X-rays, vacuum ultraviolet rays, extreme ultraviolet (EUV) or soft X-rays and a step of developing the resist layer to produce a pre-set pattern.

As the X-rays for light exposure, X-rays of arbitrary wavelengths may be used. In particular, if extreme ultraviolet (soft X-rays) with a specified wavelength of 7 to 16 nm is used, it is possible to realize light exposure with a resolution higher than is possible with the conventional method.

As the light exposure, a reduced size projection exploiting a reduced size projection optical system is used.

The high molecular material, used as the resist layer, includes e.g., NOVOLAK brand resin, polyhydroxy styrene resin, acrylic resin, siloxane resins containing ester or phenolic groups, silsesqui oxanoic resin or polycycloolefinic resin as a basic skeleton.

In these resins, as the basic skeleton, those portions undergoing chemical reactions due to the illuminated light to cause changes in the physical values of the illuminated and non-illuminated portions to manifest characteristics as a resist Material are groups, such as ester, phenolic, alcoholic or carboxylic groups.

The order of the optical absorption in the wavelength range of the extreme ultraviolet (EUV) is Si>F>O>C>H for 7 nm, F>Si>O>C>H for 10 and 11 nm and F>Si>O>C>H for 13 and 16 nm. That is, the oxygen content is not favorable insofar as optical absorption in the wavelength range of the extreme ultraviolet (EUV) of the high molecular materials is concerned.

So, according to the present invention, the proportion of carbon and hydrogen atoms to oxygen atoms is increased to effect relative thinning of the oxygen atoms in order to lower the absorption in the wavelength range of the extreme ultraviolet (EUV) of the high molecular material used as a resist material to realize the relative lowering of the oxygen atoms.

Specifically, part or all of the hydrogen atoms of the aforementioned resist materials having the aforementioned skeleton structure is replaced by an alkyl group and/or an aromatic group.

The aforementioned alkyl group or aromatic ring may be directly substituted for hydrogen atoms. Alternatively, the alkyl group or the aromatic ring may be introduced by replacing the hydrogen atoms by substituents containing alkyl groups or the aromatic rings. Any suitable substituents containing alkyl groups or aromatic rings may be used, while the number of carbon atoms in the alkyl group is arbitrary.

The basic structure of the high molecular materials (pre-existing resist material) to be subjected to substitution may already own an alkyl group(s) or an aromatic ring(s). It is because the absorption coefficients in the wavelength of the extreme ultraviolet (EUV) are lowered by further replacing part or all of the hydrogen atoms in the high molecular material owning the alkyl group(s) or the aromatic ring(s) from the outset by the alkyl group(s) or the aromatic ring(s).

By replacing the hydrogen atoms by the alkyl group(s) or the aromatic ring(s), the proportion of the carbon and hydrogen atoms may be increased to render it possible to furnish a high molecular material having a low absorption coefficient in the extreme ultraviolet wavelength range.

However, if the density of the resist material in its entirety is markedly increased by increasing the proportion of the carbon or hydrogen atoms, the possibility is high that, conversely, the absorption at the extreme ultraviolet wavelength is increased.

However, our researches have indicated that, if part or all of the hydrogen atoms in the high molecular material constituting the resist layer is replaced by the alkyl group(s) or the aromatic ring(s),the density of the entire resist material is not increased to any marked extent to render it possible to exploit the lowering of the absorption coefficient of the extreme ultraviolet wavelength effectively.

With the high molecular material, used in the present invention as the resist layer, the line absorption coefficient in the X-ray wavelength range is preferably not larger than 3.80 $\mu m^{-1}$. It is noted that, if the extreme ultraviolet light is used, the X-ray wavelength range reads extreme ultraviolet wavelength range.

If the line absorption coefficient is $3.80\mu^{-1}$ or less, the transmittance of the resist layer for the film thickness of 300 nm is of a sufficiently high value of approximately 30% or higher. If the line absorption coefficient exceeds $3.80\mu^{-1}$, with the transmittance being of a smaller value, there is a risk that the illuminated light cannot reach the deeper area in the resist layer, with the result that a resist pattern of the desirable rectangular resist pattern cannot be produced.

EXAMPLES

The present invention will now be explained with reference to specified Examples.

Theoretical Derivation of Line Absorption Coefficients

The present inventors have theoretically derived the line absorption coefficient of the high molecular materials at a wavelength of 13 nm in accordance with the following method.

In theoretically deriving the line absorption coefficient of the high molecular materials at a wavelength of 13 nm, the absorption coefficient per atom at the wavelength of 13 nm and the density of the high molecular materials are required.

As the absorption coefficient per atom at the wavelength of 13 nm, the values shown in Atomic Data and Nuclear Tables (Henke, B. L.; Gullikson, E. M.; Davis, J. C., 1993, 54,181) are used.

As long as PMMA (polymethyl methacrylate) is concerned, it is known that the line absorption coefficient at 13 nm, as found from the experimental density values, coincides with experimental values extremely satisfactorily (see J. Vac. Sci. Technol. B (Kubiak, G, D.; Kneedler, E. M.; Hwang, R. Q.; Schulberg, M. T.; Berger, K. W.: Bjorkholm, J. E., Mansfield, M. W., 1992 10.2593).

In predicting the density of the high molecular materials, the Bicerano's theory was applied (Bicerano, J. Predictions of Properties of Polymers from their Structures, Marcel Dekker; New York, 1993).

This is a type of graph theory and represents a technique which affords correlation of many physical properties with the structure of a high molecular material. The error of the density of the high molecular materials calculated by this technique is known to be 2.2% on average. So, the precision in prediction of the line absorption coefficient at a wavelength of 13 nm is also 2.2% on average.

For actual density calculations, the module Synthia "in a software application prepared by MSI Inc., San Diego, USA, was used. The computer used was a workstation Octane" manufactured by DAIKIN KOGYO SHA Co. ltd.

Substitution by Alkyl Groups

Example 1

An acrylic high molecular material (compound 1) was used as a basic high molecular material (pre-existing resist material), and line absorption coefficients on substituting propyl-, ethyl-, butyl- or hexyl groups for hydrogen atoms in this pre-existing resist material were found on calculations.

Substitution by Alkyl Groups

Example 1

An acrylic high polymer material (compound 1) was used as a basic high molecular material (pre-existing resist material) and line absorption coefficient on substitution of propyl-, ethyl-, butyl- and hexyl groups for hydrogen atoms were calculated.

The structures of the acrylic high polymer material as a basic skeleton (compound 1), compounds 2 and 3, obtained on substitution by propyl groups, compound 4, obtained on substitution by an ethyl group, compounds 5 and 6, obtained on substitution by an ethyl group for the compound 1, and compound 7 obtained on substitution by a hexyl group, are as shown in the following chemical formulas 1:

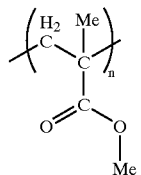
(Compound 1)

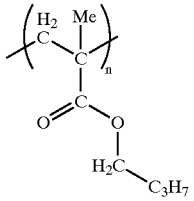
(Compound 2)

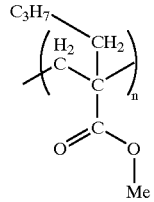
(Compound 3)

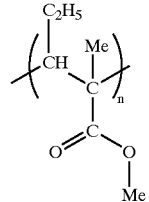
(Compound 4)

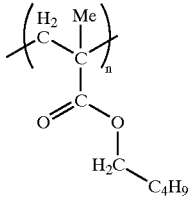
(Compound 5)

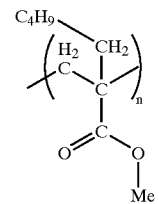
(Compund 6)

-continued

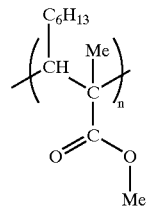
(Compound 7)

Table 1 shows calculated results of the line absorption coefficients (wavelength: 13 nm) of the respective compounds.

TABLE 1

| compounds | line absorption coefficients |
| --- | --- |
| compound 1 | $4.80\mu^{-1}$ |
| compound 2 | $3.81\mu^{-1}$ |
| compound 3 | $3.84\mu^{-1}$ |
| compound 4 | $4.02\mu^{-1}$ |
| compound 5 | $3.58\mu^{-1}$ |
| compound 6 | $3.66\mu^{-1}$ |
| compound 7 | $3.38\mu^{-1}$ |

It will be seen from Table 1 that, by substitutin various alkyl groups for hydrogen atoms, the line absorption coefficients at the wavelength of 13 nm are decreased. In particular, the line absorption coefficient is not larger than $3.80\mu^{-1}$ in case of substitution by butyl or hexyl groups.

Example 2

A polyvinylphenolic high polymer material (compound 8) was used as a basic high polymer material (pre-existing resist material), and line absorption coefficients of compounds obtained by substituting propyl groups for hydrogen atoms at various positions of the basic high polymer material were calculated.

The structures of a polyvinyl phenol based high polymer material (compound 8) as a basic skeleton and compounds obtained on substitution by propyl groups (compounds 9 to 11) are shown by the following chemical formula 2:

(Compound 8)

-continued

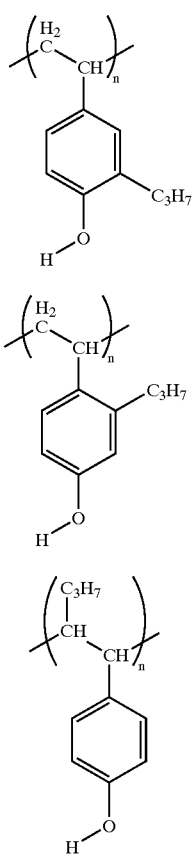

(Compound 9)

(Compound 10)

(Compound 11)

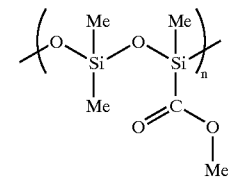

(Compound 12)

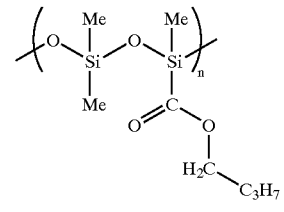

(Compound 13)

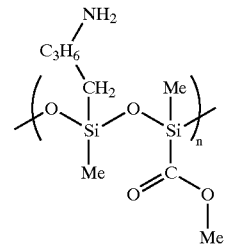

(Compound 14)

Table 2 shows calculated results of the line absorption coefficients (wavelength: 13 nm) of the respective compounds.

TABLE 2

| Compounds | line absorption coefficient |
| --- | --- |
| Compound 8 | $3.80\mu^{-1}$ |
| Compound 9 | $3.23\mu^{-1}$ |
| Compound 10 | $3.23\mu^{-1}$ |
| Compound 11 | $3.25\mu^{-}$ |

As may be seen from Table 2, the line absorption coefficient at the wavelength of 13 nm is lowered on substituting propyl groups for hydrogen atoms.

Example 3

A siloxane based high polymer material (compound 12) was used as a basic high polymer material, and its hydrogen atom was replaced by a propyl group to give a compound 13 and by an aminopropyl group to give a compound 14. The structures of the respective compounds are shown by the following chemical formulas 12 to 14:

Table 3 shows calculated results of the line absorption coefficients (wavelength: 13 nm) of the respective compounds.

TABLE 3

| Compounds | line absorption coefficient |
| --- | --- |
| Compound 12 | $3.86\mu^{-1}$ |
| Compound 13 | $3.47\mu^{-1}$ |
| Compound 14 | $3.70\mu^{-1}$ |

As may be seen from Table 3, the line absorption coefficient at the wavelength of 13 nm is lowered on substituting propyl and aminopropyl groups for hydrogen atoms.

Substitution by Aromatic Rings

Example 4

An acrylic high polymer material (compound 15) was used as a basic high polymer material (pre-existing resist material) and its hydrogen atom was replaced by a phenyl group and a naphthalene group to find the line absorption coefficients of the resulting compounds on calculations.

The structures of the acrylic high polymer material as a basic skeleton (compound 15), a compound 16 obtained on substitution by the phenyl group and a compound 17 obtained on substitution by a naphthalene group are as shown by the following chemical formulas (15) to (17):

(Compound 15)

(Compound 16)

(Compound 17)

Table 4 shows calculated results of the line absorption coefficients (wavelength: 13 nm) of the respective compounds.

TABLE 4

| Compounds | line absorption coefficient |
| --- | --- |
| Compound 15 | $4.80^{-1}$ |
| Compound 16 | $4.06^{-1}$ |
| Compound 17 | $3.96^{-1}$ |

It will be seen from table 4 that, by substituting phenyl and naphthalene groups for hydrogen atoms, the line absorption coefficients at the wavelength of 13 nm may be decreased.

Example 5

A polyvinylphenolic high polymer material (compound 18) was used as a basic high polymer material (pre-existing resist material) and line absorption coefficients of compounds obtained on substituting phenyl, naphthalene and methylphenyl groups for hydrogen atoms were calculated.

The structures of a polyvinyl phenol based high polymer material (compound 18) as a basic skeleton and a compound 19 obtained on substitution by a phenyl group, a compound 20 obtained on substitution by a naphthalene group and a compound 21 obtained on substitution by a methylphenyl group, are as shown by the following chemical formulas 18 to 21:

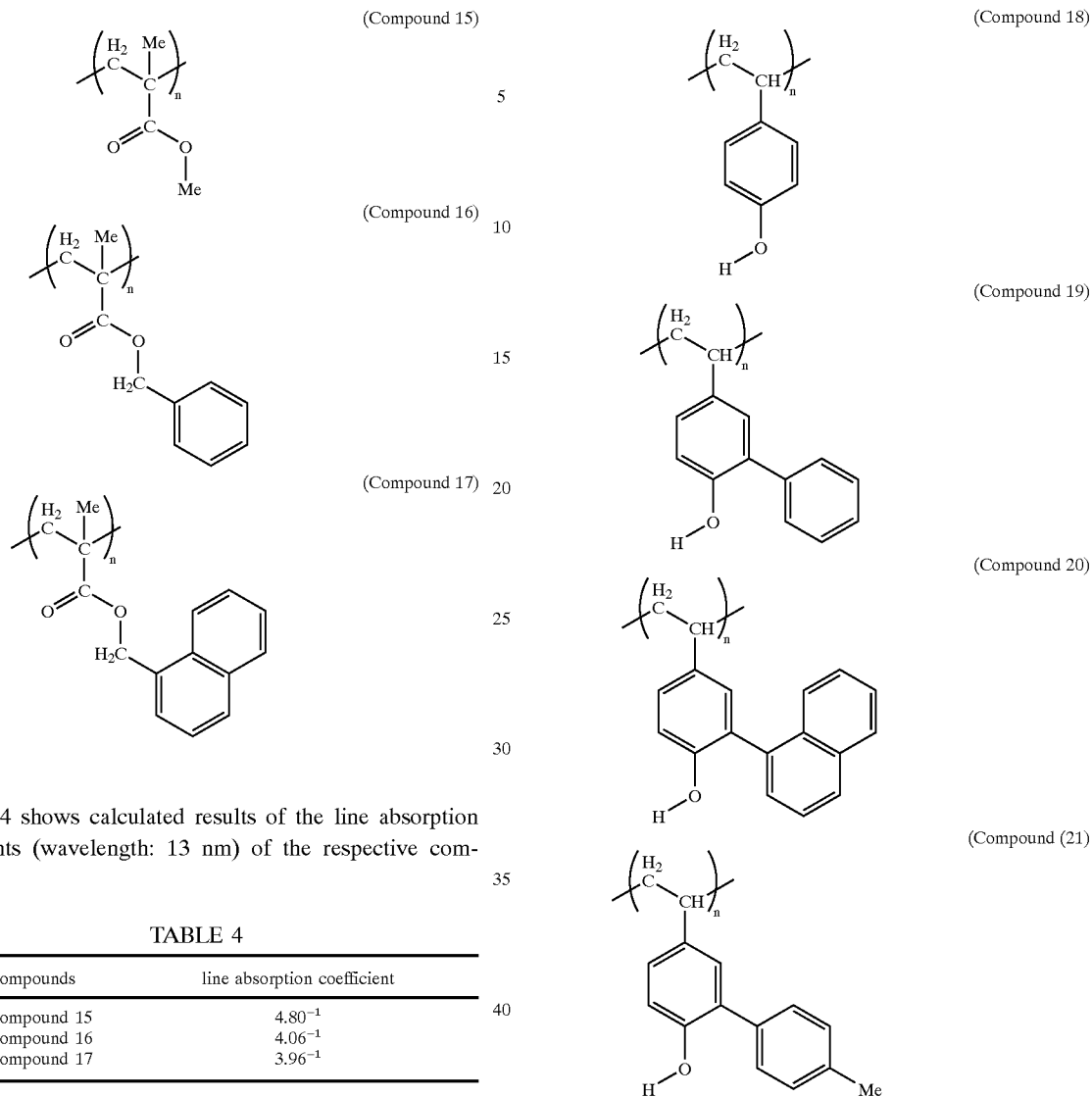

Table 5 shows calculated results of the line absorption coefficients (wavelength: 13 nm) of the respective compounds.

TABLE 5

| Compounds | line absorption coefficient |
| --- | --- |
| Compound 18 | $3.80\mu^{-1}$ |
| Compound 19 | $3.49\mu^{-1}$ |
| Compound 20 | $3.50\mu^{-1}$ |
| Compound 21 | $3.35\mu^{-1}$ |

As may be seen from Table 5, the line absorption coefficient at the wavelength of 13 nm is lowered on substituting propyl groups for hydrogen atoms.

Example 6

A siloxane based high polymer material (compound 22) was used as a basic high polymer material (pre-existing resist material) and its hydrogen atom was replaced by a phenyl group or a naphthalene group to give compounds 23, 24, respectively, and the line absorption coefficients of these compounds were calculated.

The structures of the siloxane-based high polymer material (compound 22) as a basic structure, a compound obtained on substituting a phenyl group (compound 23) and a compound obtained on substituting a naphthalene group (compound 24) are as shown by the following chemical formulas (22) to (24):

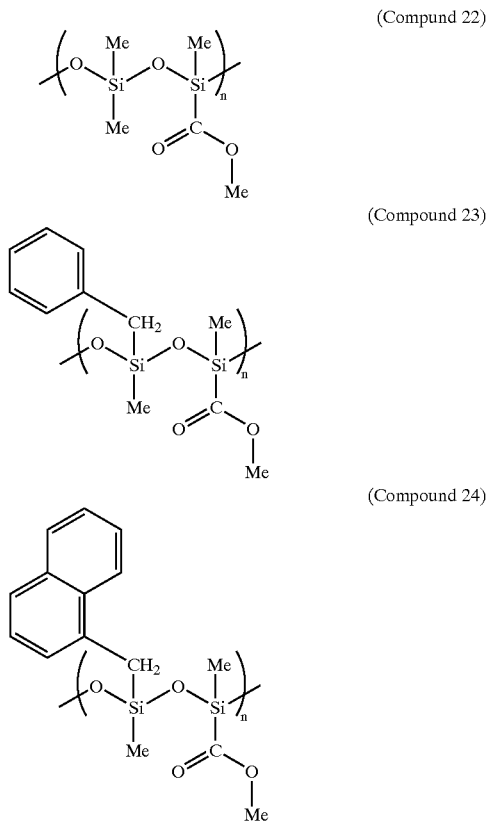

Table 6 shows calculated results of the line absorption coefficients (wavelength: 13 nm) of the respective compounds.

TABLE 6

| Compounds | line absorption coefficient |
|---|---|
| Compound 22 | $3.86\mu^{-1}$ |
| Compound 23 | $3.67\mu^{-1}$ |
| Compound 24 | $3.65\mu^{-1}$ |

It will be seen from table 4 that, by substituting phenyl and naphthalene groups for hydrogen atoms, the line absorption coefficients at the wavelength of 13 nm may be decreased.

Example 7

For a high polymer material composed of usual carbon, hydrogen and oxygen (and occasionally nitrogen), a high polymer material containing fluorine atoms, a high polymer material containing silicon (Si), and a high polymer material containing an aromatic ring, the distribution of the line absorption coefficient and the density was mapped. The results are shown in FIG. 1.

With a high polymer material into which silicon (Si) with a low line absorption coefficient is introduced, the line absorption coefficient is decreased only slightly as compared to a usual high polymer material. However, with a high polymer material into which an aromatic ring has been introduced, the line absorption coefficient is lowered to a larger extent.

Of course, with a high polymer material into which fluorine atoms with a larger line absorption coefficient are introduced, the line absorption coefficient is larger than in the usual high polymer material.

Thus, it may be seen that, with any high polymer material, the line absorption coefficient at the wavelength of 13 nm is lowered by substituting an alkyl group or an aromatic ring, such as phenyl or naphthalene groups, for a hydrogen atom of the high polymer material. That is, with substitution by alkyl groups or aromatic rings, it is possible to realize a material superior in transparency for use as a resist material.

In the foregoing description, an acrylic high molecular material, a polyvinyl phenolic high molecular material and a siloxane-based high molecular material are used as illustrative of the high molecular materials. These compounds are, however, merely illustrative such that any other suitable materials, such as other vinyl-based high molecular materials, polyimide based high molecular materials or the fluorine-based high molecular materials may also be used.

The substituents are also not limited to those shown in the examples since any suitable alkyl groups, such as methyl, pentyl or hexyl substituents, may also be used. Similarly, any suitable aromatic rings may be used as substituents, such as phenyl, naphthalene, anthracene, biphenyl or triphenyl substituents, may be used as aromatic ring substituents.

What is claimed is:

1. A light exposure method in which a resist layer is exposed selectively to X-rays, vacuum ultraviolet rays, extreme ultraviolet rays or soft X-rays to pattern the resist layer to a pre-set shape;
   wherein as a polymeric material of the resist layer, said polymeric material is obtained by:
      replacing at least a portion of hydrogen atoms of an acrylic polymeric material by a substituent containing a propyl group, an ethyl group, a butyl group and/or a hexyl group, or
      replacing at least a portion of hydrogen atoms of a polyvinylphenolic polymeric material by a substituent containing a propyl group, or
      replacing at least a portion of hydrogen atoms of a siloxane polymeric material by a substituent containing a propyl group and/or an aminopropyl group, or
      replacing at least a portion of hydrogen atoms of an acrylic polymeric material by a substituent containing a phenyl group and/or a naphthalene group, or
      replacing at least a portion of hydrogen atoms of a polyvinylphenolic polymeric material by a substituent containing a phenyl group, a naphthalene group and/or a methylphenyl group, or
      replacing at least a portion of hydrogen atoms of a siloxane polymeric material by a substituent containing a phenyl group and/or a naphthalene group, and
   wherein the line absorption coefficient in an X-ray wavelength range of the polymeric material constituting said resist layer is $3.80\mu^{-1}$ or less.

2. The light exposure method according to claim 1 wherein ultraviolet ray wavelength range is used instead of said X-ray wavelength range.

3. The light exposure method according to claim 2 wherein the wavelength of said ultraviolet rays is 7 to 16 nm.

4. The light exposure method according to claim 1 wherein said light exposure is by size-reducing projection employing a size-reducing projection optical system.

5. A light exposure method, comprising the steps of:

providing a resist material of polymeric material having hydrogen atoms wherein:

at least a portion of said hydrogen atoms of an acrylic polymeric material are replaced with a substituent containing a propyl group, an ethyl group, a butyl group and/or a hexyl group, or at least a portion of hydrogen atoms of a polyvinylphenolic polymeric material are replaced with a substituent containing a propyl group, or at least a portion of hydrogen atoms of a siloxane polymeric material are replaced with a substituent containing a propyl group and/or an aminopropyl group, or at least a portion of hydrogen atoms of an acrylic polymeric material are replaced with a substituent containing a phenyl group and/or a naphthalene group, or at least a portion of hydrogen atoms of a polyvinylphenolic polymeric material are replaced with a substituent containing a phenyl group, a naphthalene group and/or a methylphenyl group, or at least a portion of hydrogen atoms of a siloxane polymeric material are replaced with a substituent containing a phenyl group and/or a naphthalene group, said hydrogen atoms being replaced to provide a line absorption coefficient in an X-ray wavelength range of the polymeric material constituting said resist material of $3.80\mu^{-1}$ or less; and exposing said resist material selectively to X-rays, vacuum ultraviolet rays, extreme ultraviolet rays or soft X-rays to pattern the resist layer to a pre-set shape.

6. The light exposure method according to claim 5, wherein the wavelength of said ultraviolet rays is 7 to 16 nm.

7. A light exposure method for a resist layer made from a polymeric material having hydrogen atoms, comprising the steps of:

replacing at least a portion of said hydrogen atoms of said polymeric material with a substituent containing a propyl group, an ethyl group, a butyl group and/or a hexyl group, or replacing at least a portion of hydrogen atoms of a polyvinylphenolic polymeric material by a substituent containing a propyl group, or replacing at least a portion of hydrogen atoms of a siloxane polymeric material by a substituent containing a propyl group and/or an aminopropyl group, or replacing at least a portion of hydrogen atoms of an acrylic polymeric material by a substituent containing a phenyl group and/or a naphthalene group, or replacing at least a portion of hydrogen atoms of a polyvinylphenolic polymeric material by a substituent containing a phenyl group, a naphthalene group and/or a methylphenyl group, or replacing at least a portion of hydrogen atoms of a siloxane polymeric material by a substituent containing a phenyl group and/or a naphthalene group, said hydrogen atoms being replaced to provide a line absorption coefficient in an X-ray wavelength range of the polymeric material constituting said resist material of $3.80\mu^{-1}$ or less; and exposing said resist layer selectively to X-rays, vacuum ultraviolet rays, extreme ultraviolet rays or soft X-rays to pattern the resist layer to a pre-set shape.

8. The light exposure method according to claim 7, wherein the wavelength of said ultraviolet rays is 7 to 16 nm.

* * * * *